United States Patent [19]

Hirayama et al.

[11] Patent Number: 5,579,003

[45] Date of Patent: Nov. 26, 1996

[54] DIGITAL DATA MODULATION/DEMODULATION SYSTEM WHEREIN THE MODULATED DATA SATISFIES A MINIMUM RUN NUMBER OF ZEROS

[75] Inventors: Koichi Hirayama; Yoshiyuki Ishizawa, both of Kanagawa, Japan

[73] Assignee: Kabushiki Kaisha Toshiba, Kawasaki, Japan

[21] Appl. No.: 221,956

[22] Filed: Apr. 1, 1994

[30] Foreign Application Priority Data

| Apr. 2, 1993 | [JP] | Japan | 5-076692 |
| Mar. 18, 1994 | [JP] | Japan | 6-048429 |

[51] Int. Cl.⁶ .................................................. H03M 7/00
[52] U.S. Cl. .................................................. 341/59; 341/58
[58] Field of Search .................................. 341/58, 59, 68, 341/69

[56] References Cited

U.S. PATENT DOCUMENTS

| 3,685,033 | 8/1972 | Srivastava et al. | 341/68 |
| 3,689,899 | 9/1972 | Franaszek . | |
| 4,833,470 | 5/1989 | Iketani | 341/59 |
| 5,357,524 | 10/1994 | Shimpuku et al. | 341/59 |
| 5,400,023 | 3/1995 | Ino et al. | 341/59 |

FOREIGN PATENT DOCUMENTS

| 5-19332 | 3/1993 | Japan . |
| 2083322 | 3/1982 | United Kingdom . |
| 2105152 | 3/1983 | United Kingdom . |

OTHER PUBLICATIONS

Dialog® File INSPEC Abstract B91040192; Osawa et al.; *Application of new variable–length block code and Viterbi decoding using d–constraint to magneto optical recording*: Journal of Institute of Television Engineers of Japan; vol. 44, No. 10, pp. 1369–1375; Oct. 1990.

Sakamoto, et al, "Signal Processing of the Compact–Cassette Digital Recorder", J. Audio Eng. Soc., vol. 32, No. 9, pp. 647–658, Sep. 1984.

Fujiwara et al, "Essentials of Error–Control Coding Techniques", Academic Press, Inc., 1990, pp. 235–237.

Patent Abstracts of Japan, vol. 8, No. 75 (P–266) Apr. 1984 re JP-A-58-220,211.

*Primary Examiner*—Howard L. Williams
*Attorney, Agent, or Firm*—Cushman, Darby & Cushman

[57] ABSTRACT

A digital data modulation system having, a separator for separating a consecutive binary data sequence to four-bit code-words, a four-to-nine ([4,9]) converter for converting the four-bit code-words into nine-bit modulated code-words and a code selector for selecting a code among nine-bit code-words containing minimum three bits of "0" between a preceeding bit of "1" and its following bit of "1" so that there should not be less than two consecutive bits of "0" between a selecting code and a modulated code-word which is to be converted later by the [4,9] converter.

18 Claims, 14 Drawing Sheets

FIG. 1

| Dn | Tn | CONDITION BY Dn+1 |
|---|---|---|
| 0 | 010000000 | |
| 1 | 001000000 | |
| 2 | 000100000 | |
| 3 | 000010000 | |
| 4 | 000001000 | |
| 5 | 000000100 | EXCEPT (6.7.8.D.F) |
|   | 000010001 | (6.7.8.D.F) CASE (1) |
| 6 | 100010000 | |
| 7 | 100001000 | |
| 8 | 100000100 | EXCEPT (6.7.8.D.F) |
|   | 100000001 | (6.7.8.D.F)···(SEE FIG.2) |
| 9 | 010001000 | |
| A | 010000100 | EXCEPT (6.7.8.D.F) |
|   | 010000001 | (6.7.8.D.F)···(SEE FIG.2) |
| B | 001000100 | EXCEPT (6.7.8.D.F) |
|   | 001000001 | (6.7.8.D.F) CASE(1) |
| C | 001000010 | EXCEPT (0.6.7.8.9.A.D.F) |
|   | 000100001 | (6.7.8.D.F)···(SEE FIG.2) |
|   | 000000001 | (0.9.A)···(SEE FIG.3) |
| D | 100000010 | EXCEPT (0.6.7.8.9.A.D.F) |
|   | 100010001 | (6.7.8.D.F)···(SEE FIG.2) |
|   | 010000010 | (0.9.A)···(SEE FIG.3) |
| E | 000100010 | EXCEPT (0.6.7.8.9.A.D.F) |
|   | 000000010 | (6.7.8.D.F)···(SEE FIG.2) |
|   | 000000000 | (0.9.A)···(SEE FIG.4) |
| F | 100000000 | |

FIG. 2

| Dn+1 | Tn+1 | Dn+2 | Tn+2 |
|---|---|---|---|
| 6 | 000000000 | F | 100000000 |
| | | 0 | 010000000 |
| | | 1 | 001000000 |
| | | 2 | 000100000 |
| | | 3 | 000010000 |
| | | 4 | 000001000 |
| | | 6 | 100010000 |
| | | 7 | 100001000 |
| | | 9 | 010001000 |
| | 000100010 | B | 001000000 |
| | | C | 000100000 |
| | | D | 000010000 |
| | | E | 000001000 |
| | 000010001 | 5 | 000100000 |
| | | 8 | 000010000 |
| | | A | 000001000 |
| 7 | 000000100 | 0 | 010000000 |
| | | 1 | 001000000 |
| | | 2 | 000100000 |
| | | 3 | 000010000 |
| | | 4 | 000001000 |
| | | 9 | 010001000 |
| | 000000010 | B | 001000000 |
| | | C | 000100000 |
| | | D | 000010000 |
| | | E | 000001000 |
| | 000000001 | 5 | 000100000 |
| | | 8 | 000010000 |
| | | A | 000001000 |
| | 000100001 | 6 | 000010000 |
| | | 7 | 000001000 |
| | | F | 000100000 |
| 8 | 000100000 | | |
| D | 000010000 | | |
| F | 000001000 | | |

FIG. 3

| 0 | 000100000 |
|---|---|
| 9 | 000010000 |
| A | 000001000 |

FIG. 4

| 0 | 100000000 |
|---|---|
| 9 | 100010000 |
| A | 100001000 |

FIG. 11

TRUTH TABLE OF TLGC(e)

| d3 | d2 | d1 | d0 | SL1 | t8 | t7 | t6 | t5 | t4 | t3 | t2 | t1 | t0 |
|---|---|---|---|---|---|---|---|---|---|---|---|---|---|
| 0 | 0 | 0 | 0 | * | 0 | 1 | 0 | 0 | 0 | 0 | 0 | 0 | 0 |
| 0 | 0 | 0 | 1 | * | 0 | 0 | 1 | 0 | 0 | 0 | 0 | 0 | 0 |
| 0 | 0 | 1 | 0 | * | 0 | 0 | 0 | 1 | 0 | 0 | 0 | 0 | 0 |
| 0 | 0 | 1 | 1 | * | 0 | 0 | 0 | 0 | 1 | 0 | 0 | 0 | 0 |
| 0 | 1 | 0 | 0 | * | 0 | 0 | 0 | 0 | 0 | 1 | 0 | 0 | 0 |
| 0 | 1 | 0 | 1 | * | 0 | 0 | 0 | 1 | 0 | 0 | 0 | 0 | 0 |
| 0 | 1 | 1 | 0 | 0 | 1 | 0 | 0 | 0 | 1 | 0 | 0 | 0 | 0 |
| 0 | 1 | 1 | 0 | 1 | 0 | 0 | 0 | 0 | 1 | 0 | 0 | 0 | 0 |
| 0 | 1 | 1 | 1 | 0 | 1 | 0 | 0 | 0 | 0 | 1 | 0 | 0 | 0 |
| 0 | 1 | 1 | 1 | 1 | 0 | 0 | 0 | 0 | 0 | 1 | 0 | 0 | 0 |
| 1 | 0 | 0 | 0 | * | 0 | 0 | 0 | 0 | 1 | 0 | 0 | 0 | 0 |
| 1 | 0 | 0 | 1 | * | 0 | 1 | 0 | 0 | 0 | 1 | 0 | 0 | 0 |
| 1 | 0 | 1 | 0 | * | 0 | 0 | 0 | 0 | 0 | 1 | 0 | 0 | 0 |
| 1 | 0 | 1 | 1 | * | 0 | 0 | 1 | 0 | 0 | 0 | 0 | 0 | 0 |
| 1 | 1 | 0 | 0 | * | 0 | 0 | 0 | 1 | 0 | 0 | 0 | 0 | 0 |
| 1 | 1 | 0 | 1 | * | 0 | 0 | 0 | 0 | 1 | 0 | 0 | 0 | 0 |
| 1 | 1 | 1 | 0 | * | 0 | 0 | 0 | 0 | 0 | 1 | 0 | 0 | 0 |
| 1 | 1 | 1 | 1 | 0 | 1 | 0 | 0 | 0 | 0 | 0 | 0 | 0 | 0 |
| 1 | 1 | 1 | 1 | 1 | 0 | 0 | 0 | 1 | 0 | 0 | 0 | 0 | 0 |

FIG. 7

TRUTH TABLE OF TLGC (d)

| d3 | d2 | d1 | d0 | SL1 | SL2 | t8 | t7 | t6 | t5 | t4 | t3 | t2 | t1 | t0 | SF1 |
|---|---|---|---|---|---|---|---|---|---|---|---|---|---|---|---|
| 0 | 0 | 0 | 0 | * | * | 0 | 1 | 0 | 0 | 0 | 0 | 0 | 0 | 0 | 0 |
| 0 | 0 | 0 | 1 | * | * | 0 | 0 | 1 | 0 | 0 | 0 | 0 | 0 | 0 | 0 |
| 0 | 0 | 1 | 0 | * | * | 0 | 0 | 0 | 1 | 0 | 0 | 0 | 0 | 0 | 0 |
| 0 | 0 | 1 | 1 | * | * | 0 | 0 | 0 | 0 | 1 | 0 | 0 | 0 | 0 | 0 |
| 0 | 1 | 0 | 0 | * | * | 0 | 0 | 0 | 0 | 0 | 1 | 0 | 0 | 0 | 0 |
| 0 | 1 | 0 | 1 | 0 | * | 0 | 0 | 0 | 0 | 0 | 0 | 1 | 0 | 0 | 0 |
| 0 | 1 | 0 | 1 | 1 | 0 | 0 | 0 | 0 | 0 | 1 | 0 | 0 | 1 | 0 | 1 |
| 0 | 1 | 1 | 0 | * | * | 1 | 0 | 0 | 0 | 1 | 0 | 0 | 0 | 0 | 0 |
| 0 | 1 | 1 | 1 | * | * | 1 | 0 | 0 | 0 | 0 | 1 | 0 | 0 | 0 | 0 |
| 1 | 0 | 0 | 0 | 0 | * | 1 | 0 | 0 | 0 | 0 | 0 | 1 | 0 | 0 | 0 |
| 1 | 0 | 0 | 0 | 1 | 0 | 1 | 0 | 0 | 0 | 0 | 0 | 0 | 1 | 0 | 1 |
| 1 | 0 | 0 | 1 | * | * | 0 | 1 | 0 | 0 | 1 | 0 | 0 | 0 | 0 | 0 |
| 1 | 0 | 1 | 0 | 0 | * | 0 | 1 | 0 | 0 | 0 | 1 | 0 | 0 | 0 | 0 |
| 1 | 0 | 1 | 0 | 1 | 0 | 0 | 1 | 0 | 0 | 0 | 0 | 0 | 1 | 0 | 1 |
| 1 | 0 | 1 | 1 | 0 | * | 0 | 0 | 1 | 0 | 0 | 0 | 1 | 0 | 0 | 0 |
| 1 | 0 | 1 | 1 | 1 | 0 | 0 | 0 | 1 | 0 | 0 | 0 | 0 | 1 | 0 | 1 |
| 1 | 1 | 0 | 0 | 0 | 0 | 0 | 0 | 1 | 0 | 0 | 0 | 0 | 1 | 0 | 0 |
| 1 | 1 | 0 | 0 | 1 | 0 | 0 | 0 | 1 | 0 | 0 | 0 | 0 | 1 | 0 | 1 |
| 1 | 1 | 0 | 0 | 0 | 1 | 0 | 0 | 0 | 0 | 0 | 0 | 0 | 1 | 1 | 1 |
| 1 | 1 | 0 | 1 | 0 | 0 | 1 | 0 | 0 | 0 | 0 | 0 | 0 | 1 | 0 | 0 |
| 1 | 1 | 0 | 1 | 1 | 0 | 1 | 0 | 0 | 0 | 1 | 0 | 0 | 0 | 1 | 1 |
| 1 | 1 | 0 | 1 | 0 | 1 | 0 | 1 | 0 | 0 | 0 | 0 | 0 | 1 | 0 | 1 |
| 1 | 1 | 1 | 0 | 0 | 0 | 0 | 0 | 1 | 0 | 0 | 0 | 0 | 1 | 0 | 0 |
| 1 | 1 | 1 | 0 | 1 | 0 | 0 | 0 | 0 | 0 | 0 | 0 | 0 | 1 | 0 | 1 |
| 1 | 1 | 1 | 0 | 0 | 1 | 0 | 0 | 0 | 0 | 0 | 0 | 0 | 0 | 1 | 1 |
| 1 | 1 | 1 | 1 | * | * | 1 | 0 | 0 | 0 | 0 | 0 | 0 | 0 | 0 | 0 |

(SL1 & SL2 --- NOT TAKE "1" SIMULTANEOUSLY)

FIG. 8
TRUTH TABLE OF TLGC(b)

| d3 | d2 | d1 | d0 | SL3 | SL4 | SL5 | t8 | t7 | t6 | t5 | t4 | t3 | t2 | t1 | t0 | SP2 |
|----|----|----|----|-----|-----|-----|----|----|----|----|----|----|----|----|----|-----|
| 0 | 1 | 1 | 0 | 0 | 0 | * | 0 | 0 | 0 | 0 | 0 | 0 | 0 | 0 | 0 | 1 |
| 0 | 1 | 1 | 0 | 1 | 0 | 0 | 0 | 0 | 0 | 1 | 0 | 0 | 0 | 1 | 0 | 1 |
| 0 | 1 | 1 | 0 | 0 | 1 | 0 | 0 | 0 | 0 | 0 | 1 | 0 | 0 | 0 | 1 | 1 |
| 0 | 1 | 1 | 1 | 0 | 0 | 0 | 0 | 0 | 0 | 0 | 0 | 0 | 1 | 0 | 0 | 1 |
| 0 | 1 | 1 | 1 | 1 | 0 | 0 | 0 | 0 | 0 | 0 | 0 | 0 | 0 | 1 | 0 | 1 |
| 0 | 1 | 1 | 1 | 0 | 1 | 0 | 0 | 0 | 0 | 0 | 0 | 0 | 0 | 0 | 1 | 1 |
| 0 | 1 | 1 | 1 | 0 | 0 | 1 | 0 | 0 | 0 | 1 | 0 | 0 | 0 | 1 | 1 | 1 |
| EXCEPT ABOVE | | | | | | | 0 | 0 | 0 | 0 | 0 | 0 | 0 | 0 | 0 | 0 |

FIG. 9
TRUTH TABLE OF TLGC(c)

| d3 | d2 | d1 | d0 | t8 | t7 | t6 | t5 | t4 | t3 | t2 | t1 | t0 |
|----|----|----|----|----|----|----|----|----|----|----|----|----|
| 1 | 0 | 0 | 0 | 0 | 0 | 0 | 1 | 0 | 0 | 0 | 0 | 0 |
| 1 | 1 | 0 | 1 | 0 | 0 | 0 | 0 | 1 | 0 | 0 | 0 | 0 |
| 1 | 1 | 1 | 1 | 0 | 0 | 0 | 0 | 0 | 1 | 0 | 0 | 0 |
|  |  |  |  | 0 | 0 | 0 | 0 | 0 | 0 | 0 | 0 | 0 |

FIG. 10
TRUTH TABLE OF TLGC(d)

| d3 | d2 | d1 | d0 | SL6 | t8 | t7 | t6 | t5 | t4 | t3 | t2 | t1 | t0 |
|----|----|----|----|-----|----|----|----|----|----|----|----|----|----|
| 0 | 0 | 0 | 0 | 0 | 0 | 0 | 0 | 1 | 0 | 0 | 0 | 0 | 0 |
| 0 | 0 | 0 | 0 | 1 | 1 | 0 | 0 | 0 | 0 | 0 | 0 | 0 | 0 |
| 1 | 0 | 0 | 1 | 0 | 0 | 0 | 0 | 0 | 1 | 0 | 0 | 0 | 0 |
| 1 | 0 | 0 | 1 | 1 | 1 | 0 | 0 | 0 | 1 | 0 | 0 | 0 | 0 |
| 1 | 0 | 1 | 0 | 0 | 0 | 0 | 0 | 0 | 0 | 1 | 0 | 0 | 0 |
| 1 | 0 | 1 | 0 | 1 | 1 | 0 | 0 | 0 | 0 | 1 | 0 | 0 | 0 |
|  |  |  |  |  | 0 | 0 | 0 | 0 | 0 | 0 | 0 | 0 | 0 |

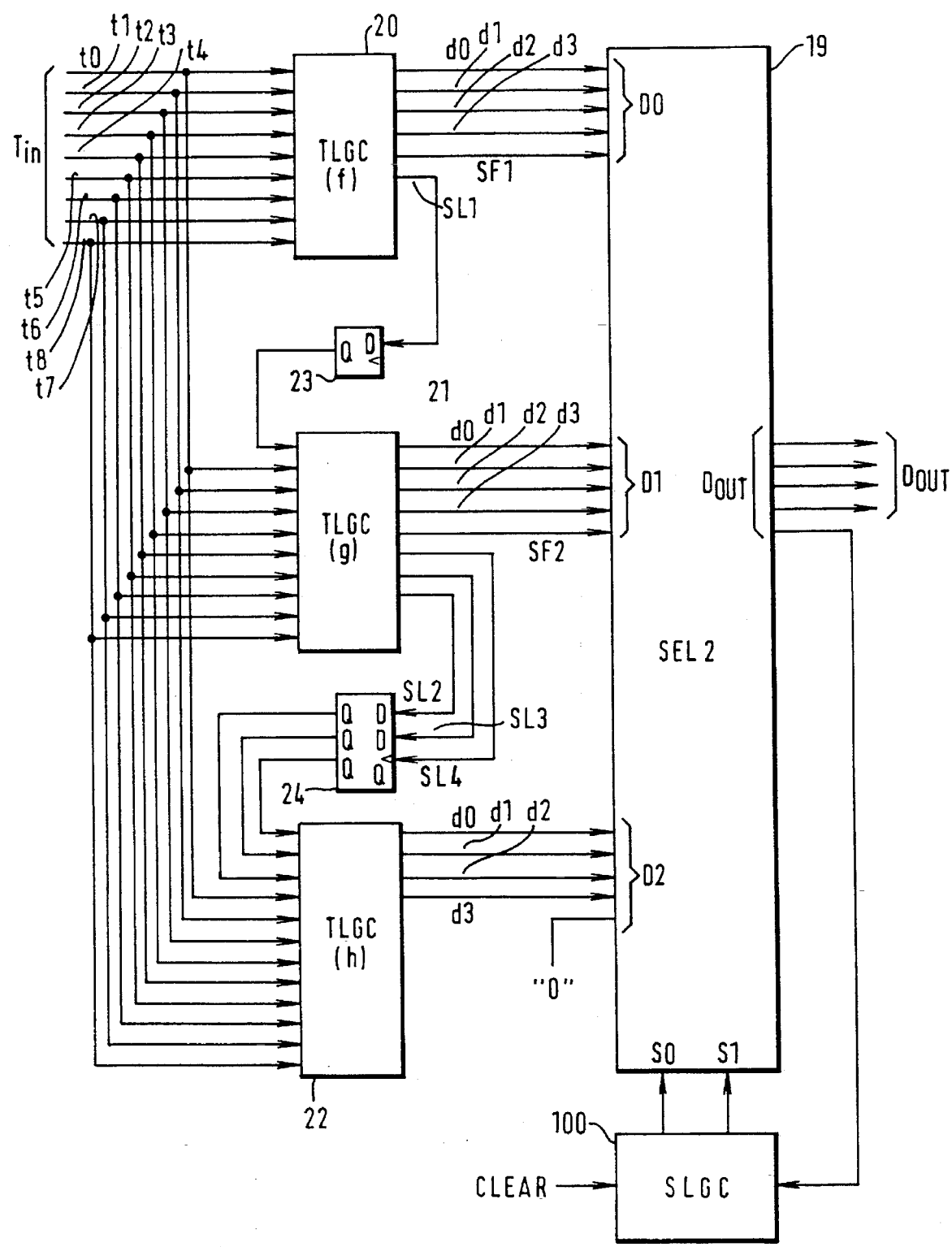

FIG. 13

TRUTH TABLE OF TLGC (f)

| t8 | t7 | t6 | t5 | t4 | t3 | t2 | t1 | t0 | d3 | d2 | d1 | d0 | SL1 | SF1 |
|---|---|---|---|---|---|---|---|---|---|---|---|---|---|---|
| 0 | 1 | 0 | 0 | 0 | 0 | 0 | 0 | 0 | 0 | 0 | 0 | 0 | 0 | 0 |
| 0 | 0 | 1 | 0 | 0 | 0 | 0 | 0 | 0 | 0 | 0 | 0 | 1 | 0 | 0 |
| 0 | 0 | 0 | 1 | 0 | 0 | 0 | 0 | 0 | 0 | 0 | 1 | 0 | 0 | 0 |
| 0 | 0 | 0 | 0 | 1 | 0 | 0 | 0 | 0 | 0 | 0 | 1 | 1 | 0 | 0 |
| 0 | 0 | 0 | 0 | 0 | 1 | 0 | 0 | 0 | 0 | 1 | 0 | 0 | 0 | 0 |
| 0 | 0 | 0 | 0 | 0 | 0 | 1 | 0 | 0 | 0 | 1 | 0 | 1 | 0 | 0 |
| 0 | 0 | 0 | 0 | 1 | 0 | 0 | 0 | 1 | 0 | 1 | 0 | 1 | 0 | 1 |
| 1 | 0 | 0 | 0 | 1 | 0 | 0 | 0 | 0 | 0 | 1 | 1 | 0 | 0 | 0 |
| 1 | 0 | 0 | 0 | 0 | 1 | 0 | 0 | 0 | 0 | 1 | 1 | 1 | 0 | 0 |
| 1 | 0 | 0 | 0 | 0 | 0 | 1 | 0 | 0 | 1 | 0 | 0 | 0 | 0 | 0 |
| 1 | 0 | 0 | 0 | 0 | 0 | 0 | 0 | 1 | 1 | 0 | 0 | 0 | 0 | 1 |
| 0 | 1 | 0 | 0 | 0 | 1 | 0 | 0 | 0 | 1 | 0 | 0 | 1 | 0 | 0 |
| 0 | 1 | 0 | 0 | 0 | 0 | 1 | 0 | 0 | 1 | 0 | 1 | 0 | 0 | 0 |
| 0 | 1 | 0 | 0 | 0 | 0 | 0 | 0 | 1 | 1 | 0 | 1 | 0 | 0 | 1 |
| 0 | 0 | 1 | 0 | 0 | 0 | 1 | 0 | 0 | 1 | 0 | 1 | 1 | 0 | 0 |
| 0 | 0 | 1 | 0 | 0 | 0 | 0 | 0 | 1 | 1 | 0 | 1 | 1 | 0 | 1 |
| 0 | 0 | 1 | 0 | 0 | 0 | 0 | 1 | 0 | 1 | 1 | 0 | 0 | 0 | 0 |
| 0 | 0 | 0 | 1 | 0 | 0 | 0 | 0 | 1 | 1 | 1 | 0 | 0 | 0 | 1 |
| 0 | 0 | 0 | 0 | 0 | 0 | 0 | 0 | 1 | 1 | 1 | 0 | 0 | 1 | 1 |
| 1 | 0 | 0 | 0 | 0 | 0 | 0 | 1 | 0 | 1 | 1 | 0 | 1 | 0 | 0 |
| 1 | 0 | 0 | 0 | 1 | 0 | 0 | 0 | 1 | 1 | 1 | 0 | 1 | 0 | 1 |
| 0 | 1 | 0 | 0 | 0 | 0 | 0 | 1 | 0 | 1 | 1 | 0 | 1 | 1 | 1 |
| 0 | 0 | 0 | 1 | 0 | 0 | 0 | 1 | 0 | 1 | 1 | 1 | 0 | 0 | 0 |
| 0 | 0 | 0 | 0 | 0 | 0 | 0 | 1 | 0 | 1 | 1 | 1 | 0 | 0 | 1 |
| 0 | 0 | 0 | 0 | 0 | 0 | 0 | 0 | 0 | 1 | 1 | 1 | 0 | 1 | 1 |
| 1 | 0 | 0 | 0 | 0 | 0 | 0 | 0 | 0 | 1 | 1 | 1 | 1 | 0 | 0 |

FIG. 14

TRUTH TABLE OF TLGC(g)

| t8 | t7 | t6 | t5 | t4 | t3 | t2 | t1 | t0 | SL1 | d3 | d2 | d1 | d0 | SL2 | SL3 | SL4 | SF2 |
|---|---|---|---|---|---|---|---|---|---|---|---|---|---|---|---|---|---|
| 0 | 0 | 0 | 0 | 0 | 0 | 0 | 0 | 0 | 0 | 0 | 1 | 1 | 0 | 0 | 0 | 0 | 1 |
| 0 | 0 | 0 | 1 | 0 | 0 | 0 | 1 | 0 | 0 | 0 | 1 | 1 | 0 | 1 | 0 | 0 | 1 |
| 0 | 0 | 0 | 0 | 1 | 0 | 0 | 1 | 0 | 0 | 0 | 1 | 1 | 0 | 0 | 1 | 0 | 1 |
| 0 | 0 | 0 | 0 | 0 | 0 | 1 | 0 | 0 | 0 | 0 | 1 | 1 | 1 | 0 | 0 | 0 | 1 |
| 0 | 0 | 0 | 0 | 0 | 0 | 0 | 1 | 0 | 0 | 0 | 1 | 1 | 1 | 1 | 0 | 0 | 1 |
| 0 | 0 | 0 | 0 | 0 | 0 | 0 | 0 | 1 | 0 | 0 | 1 | 1 | 1 | 0 | 1 | 0 | 1 |
| 0 | 0 | 0 | 1 | 0 | 0 | 0 | 0 | 1 | 0 | 0 | 1 | 1 | 1 | 0 | 0 | 1 | 1 |
| 0 | 0 | 0 | 1 | 0 | 0 | 0 | 0 | 0 | 0 | 1 | 0 | 0 | 0 | 0 | 0 | 0 | 0 |
| 0 | 0 | 0 | 0 | 1 | 0 | 0 | 0 | 0 | 0 | 1 | 1 | 0 | 1 | 0 | 0 | 0 | 0 |
| 0 | 0 | 0 | 0 | 0 | 1 | 0 | 0 | 0 | 0 | 1 | 1 | 1 | 1 | 0 | 0 | 0 | 0 |
| 0 | 0 | 0 | 1 | 0 | 0 | 0 | 0 | 0 | 1 | 0 | 0 | 0 | 0 | 0 | 0 | 0 | 0 |
| 1 | 0 | 0 | 0 | 0 | 0 | 0 | 0 | 0 | 1 | 0 | 0 | 0 | 0 | 0 | 0 | 0 | 0 |
| 0 | 0 | 0 | 0 | 1 | 0 | 0 | 0 | 0 | 1 | 1 | 0 | 0 | 1 | 0 | 0 | 0 | 0 |
| 1 | 0 | 0 | 0 | 1 | 0 | 0 | 0 | 0 | 1 | 1 | 0 | 0 | 1 | 0 | 0 | 0 | 0 |
| 0 | 0 | 0 | 0 | 0 | 1 | 0 | 0 | 0 | 1 | 1 | 0 | 1 | 0 | 0 | 0 | 0 | 0 |
| 1 | 0 | 0 | 0 | 0 | 1 | 0 | 0 | 0 | 1 | 1 | 0 | 1 | 0 | 0 | 0 | 0 | 0 |

FIG. 15

TRUTH TABLE OF TLGC(h)

| t8 | t7 | t6 | t5 | t4 | t3 | t2 | t1 | t0 | SL2 | SL3 | SL4 | d3 | d2 | d1 | d0 |
|----|----|----|----|----|----|----|----|----|-----|-----|-----|----|----|----|----|
| 0  | 1  | 0  | 0  | 0  | 0  | 0  | 0  | 0  | 0   | 0   | 0   | 0  | 0  | 0  | 0  |
| 0  | 0  | 1  | 0  | 0  | 0  | 0  | 0  | 0  | 0   | 0   | 0   | 0  | 0  | 0  | 1  |
| 0  | 0  | 0  | 1  | 0  | 0  | 0  | 0  | 0  | 0   | 0   | 0   | 0  | 0  | 1  | 0  |
| 0  | 0  | 0  | 0  | 1  | 0  | 0  | 0  | 0  | 0   | 0   | 0   | 0  | 0  | 1  | 1  |
| 0  | 0  | 0  | 0  | 0  | 1  | 0  | 0  | 0  | 0   | 0   | 0   | 0  | 1  | 0  | 0  |
| 0  | 1  | 0  | 0  | 0  | 1  | 0  | 0  | 0  | 0   | 0   | 0   | 1  | 0  | 0  | 1  |
| 0  | 0  | 1  | 0  | 0  | 0  | 0  | 0  | 0  | 1   | 0   | 0   | 1  | 0  | 1  | 1  |
| 0  | 0  | 0  | 1  | 0  | 0  | 0  | 0  | 0  | 1   | 0   | 0   | 1  | 1  | 0  | 0  |
| 0  | 0  | 0  | 0  | 1  | 0  | 0  | 0  | 0  | 1   | 0   | 0   | 1  | 1  | 0  | 1  |
| 0  | 0  | 0  | 0  | 0  | 1  | 0  | 0  | 0  | 1   | 0   | 0   | 1  | 1  | 1  | 0  |
| 0  | 0  | 0  | 1  | 0  | 0  | 0  | 0  | 0  | 0   | 1   | 0   | 0  | 1  | 0  | 1  |
| 0  | 0  | 0  | 0  | 1  | 0  | 0  | 0  | 0  | 0   | 1   | 0   | 1  | 0  | 0  | 0  |
| 0  | 0  | 0  | 0  | 0  | 1  | 0  | 0  | 0  | 0   | 1   | 0   | 1  | 0  | 1  | 0  |
| 1  | 0  | 0  | 0  | 1  | 0  | 0  | 0  | 0  | 0   | 0   | 1   | 0  | 1  | 1  | 0  |
| 0  | 0  | 0  | 0  | 1  | 0  | 0  | 0  | 0  | 0   | 0   | 1   | 0  | 1  | 1  | 0  |
| 1  | 0  | 0  | 0  | 0  | 1  | 0  | 0  | 0  | 0   | 0   | 1   | 0  | 1  | 1  | 1  |
| 0  | 0  | 0  | 0  | 0  | 1  | 0  | 0  | 0  | 0   | 0   | 1   | 0  | 1  | 1  | 1  |
| 1  | 0  | 0  | 0  | 0  | 0  | 0  | 0  | 0  | 0   | 0   | 1   | 1  | 1  | 1  | 1  |
| 0  | 0  | 0  | 1  | 0  | 0  | 0  | 0  | 0  | 0   | 0   | 1   | 1  | 1  | 1  | 1  |

| Dn | Tn | | | | | | | | | DC CONTROL CODE | | | | | | | | |
|---|---|---|---|---|---|---|---|---|---|---|---|---|---|---|---|---|---|---|
| C | 0 | 0 | 0 | 0 | 0 | 0 | 0 | 0 | 1 | 0 | 0 | 0 | 0 | 0 | 1 | 0 | 0 | 0 |
|   | 0 | 0 | 0 | 1 | 0 | 0 | 0 | 0 | 1 |   |   |   |   |   |   |   |   |   |
| D | 1 | 0 | 0 | 0 | 1 | 0 | 0 | 0 | 1 | 0 | 0 | 0 | 0 | 0 | 1 | 0 | 0 | 0 |
|   | 0 | 1 | 0 | 0 | 0 | 0 | 0 | 1 | 0 |   |   |   |   |   |   |   |   |   |
| E | 0 | 0 | 0 | 0 | 0 | 0 | 0 | 1 | 0 | 0 | 0 | 0 | 0 | 0 | 1 | 0 | 0 | 0 |
|   | 0 | 0 | 0 | 1 | 0 | 0 | 0 | 1 | 0 |   |   |   |   |   |   |   |   |   |

| Dn+1 | Tn+1 | | | | | | | | | DC CONTROL CODE | | | | | | | | |
|---|---|---|---|---|---|---|---|---|---|---|---|---|---|---|---|---|---|---|
| 6 | 0 | 0 | 0 | 0 | 0 | 0 | 0 | 0 | 0 | 0 | 1 | 0 | 0 | 0 | 1 | 0 | 0 | 0 |
|   |   |   |   |   |   |   |   |   |   | 0 | 0 | 0 | 0 | 0 | 1 | 0 | 0 | 0 |
| 7 | 0 | 0 | 0 | 0 | 0 | 0 | 1 | 0 | 0 | 0 | 1 | 0 | 0 | 0 | 1 | 0 | 0 | 0 |
|   |   |   |   |   |   |   |   |   |   | 0 | 0 | 0 | 0 | 0 | 1 | 0 | 0 | 0 |

DIGITAL DATA MODULATION/DEMODULATION SYSTEM WHEREIN THE MODULATED DATA SATISFIES A MINIMUM RUN NUMBER OF ZEROS

FIELD OF THE INVENTION

The present invention generally relates to a digital data modulation/demodulation system, and more particularly, to a modulator/demodulator which is used for digital data recording/reproducing to/from optical discs etc., or communication transmission.

BACKGROUND OF THE INVENTION

An EFM (Eight-to-Fourteen Modulation) system, where fixed length words are used for storing audio signals on a CD (Compact Disc) is disclosed in the Japanese Patent Disclosure (Tokkai-Sho) 57-48848 (now granted as Tokko-Hei 05-19332). A Run-Length Limited two-to-seven (hereinafter referred to as RLL [2,7]) modulation system adopted for a writable optical disc is disclosed in the Japanese Patent Disclosure (Tokkai-Sho) 50-142131 (or corresponding U.S. Pat. No. 3,689,899).

However, in order to achieve high-density recording in the conventional EFM modulation system and a two-to-seven (hereinafter referred to as [2,7]) modulation system, a short-wave laser had to be developed to fully achieve large capacity storage media for image data etc. Such as laser is currently under development.

In the modulation systems described above, characteristic parameters of the modulated codes after conversion, such as a bit interval T, a minimum inversion interval Tmin, a maximum inversion interval Tmax, a detection window width Tw, a digital sum value DSV, etc., have been established. In particular, for high-density recording, the minimum inversion interval Tmin and the detection window width Tw should be large while the maximum inversion interval Tmax should be as small as possible. The minimum inversion interval Tmin is the most important parameter as it directly affects the shortest bit length that can be reconstructed on an optical disc.

The shortest writable or readable bit length on a disc is determined by an attribute of the light source, i.e., the wavelength of a laser beam generated from an optical head for writing or reading optical data on a disc, as well as the numerical aperture NA of an optical objective lens so that the light spot diameter is as small as possible. Therefore, in order to reduce the bit length and increase the recording density, a laser with short wavelength beam was needed. Also, the numerical aperture NA has to be expanded. However, it was difficult to limit a writable disc bit length to below a fixed value as it was difficult to use them in practice.

Thus, in order to in the present writable and readable bit lengths, developing a modulation system having a larger minimum inversion interval Tmin using the current laser technology is an alternative approach. Further, when the minimum inversion interval Tmin is made large, it sacrifices or deteriorates other characteristic parameters. That is, maximum inversion interval Tmax, detection window width Tw, etc. may be deteriorated. However, the effects can be suppressed through signal processing when data are reconstructed. Therefore, in order to achieve a high density recording in a system utilizing the current optical system, it is indispensable to develop a modulation system having a sufficient length for the minimum inversion interval Tmin.

As described above, conventional digital data modulation systems, such as the EFM modulation system and the [2,7] modulation system, are disadvantageous in that a priority of their performance is placed on simplifying data reconstruction or demodulation. As a result, the minimum inversion interval Tmin is insufficient for realizing a large capacity optical disc intended for image data storage.

SUMMARY OF THE INVENTION

It is, therefore, an object of the present invention to provide a digital data modulation/demodulation system which are the defects described above to provide high density recording of data using currently available optical systems.

In order to achieve the above object, a digital data modulation/demodulation system according to one aspect of the present invention includes a separator for separating a consecutive binary data sequence into four-bit code-words, a four-to-nine (hereinafter referred to as [4,9]) converter using variable length words for converting the separated four-bit code-words into nine-bit modulated code-words having three consecutive bits of "0" and a code selecting means for selecting a modulated code-word among nine-bit code-words having a minimum three bits of "0" between a first bit of "1" and a following second bit of "1", so that there should not be less than two consecutive bits of "0" between preceding and succeeding modulated code-words.

In the modulator/demodulator having the arrangement as described above, when separating a consecutive binary data sequence into four-bit code-words and converting the separated four-bit code-words into nine-bit modulated code-words, bits are controlled by a code selecting means so that less than two consecutive bits of "0" are not generated between a current modulated code-word and a modulated code-word to be converted next.

Additional objects and advantages of the present invention will be apparent to persons skilled in the art based on the following description and the accompanying drawings, which are hereby incorporated in and constitute a part of this specification.

BRIEF DESCRIPTION OF THE DRAWINGS

A more complete appreciation of the present invention and many of the attendant advantages thereof will be appreciated upon considering to the following detailed description in connection with the accompanying drawings, wherein:

FIGS. 1 through 4 are explanatory diagrams of code conversion tables showing an embodiment of the present invention;

FIG. 7 through 11 are truth tables for conversion logic circuits TLGC(a) through TLGC(e) of the encoder shown in FIG. 5;

FIG. 12 is a circuit block diagram of the decoder of the present invention based on the conversion tables shown in FIGS. 1 through 4;

FIGS. 13 through 15 are truth tables of conversion logic circuits TLGC(f) through TLGC(h) of the decoder shown in FIG. 12;

DESCRIPTION OF THE PREFERRED EMBODIMENTS

The present invention will be described in detail with reference to the FIGS. 1 through 20.

FIG. 1 is an explanatory diagram of a code conversion table showing an embodiment of the present invention. Dn represents an input binary data sequence separated into four bit code-words and expressed in hexadecimal notation. Tn represents a binary bit pattern after converting the input Dn into nine-bit data. Only Tn patterns having a minimum of three bits of "0" between a preceding bit "1" and a succeeding bit "1" one selected.

For some Dn, there are provided two to three kinds of Tn patterns for balancing the input data Dn with a input data (Dn+1), wherein the Tn pattern is specified according to a value of Dn+1. For instance, if Dn=5, two kinds of Tn: "000000100" and "000010001" are provided, when Dn+1 is 6, 7, 8, D, or F, data is converted into "000010001" and in other cases, it is converted into "000000100". If "000010001" is selected as Tn, data is converted according to a conversion table shown in FIG. 2 for Dn+1 and for Dn+2 in some cases.

In a specified example, if D=5, Dn+1=6, Dn+2=7, they are converted as Tn="000010001", Tn+1="000000000" and Tn+2="100000000". Further, if Dn=C, three kinds of Tn: "001000010", "000100001" and "000000001" are provided as shown in FIG. 1. If Dn+1=6, 7, 8, D or F, it is converted into "000100001", if Dn+1=9 or A, it is converted into "000000001" and in all other cases, data is converted into "001000010". For instance, if Dn=C, Dn+1=0, they are converted into Tn="000000001" and Tn+1="000100000" according to a table shown in FIG. 3.

Likewise, if Dn=D or E, three kinds of Tn+1 shown in FIG. 1 are provided. Further, if Dn=E and Dn+1=0, 9 or A, Tn+1 is specified according to a table shown in FIG. 4. This is because the number of zero bits "0" can be reduced beyond that possible using the table shown in FIG. 3. If maximum inversion interval Tmax is not a problem, there will be no problem even when the conversion is made according to the table shown in FIG. 3.

Figure 5A:
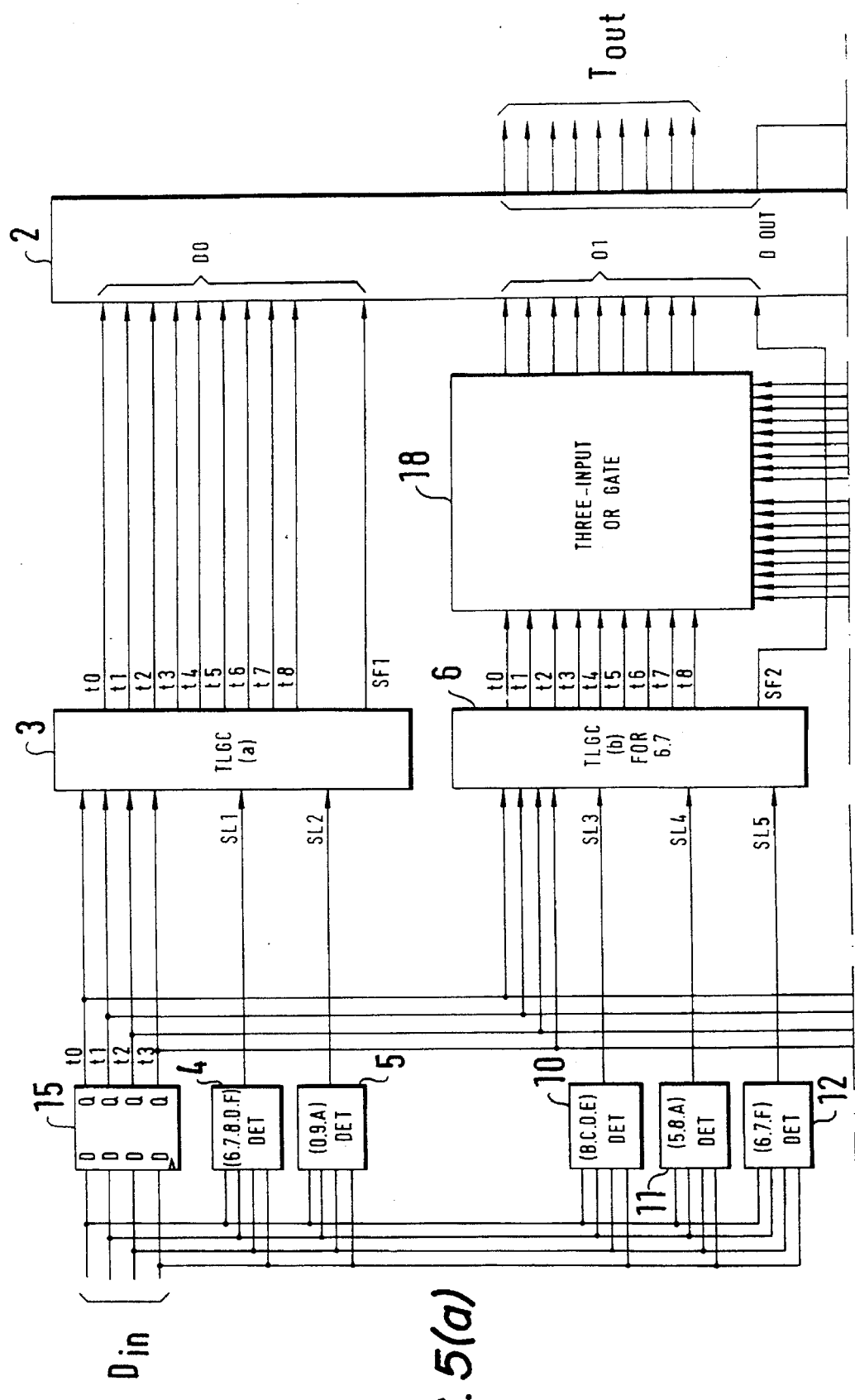
FIGS. 5(a) and 5(b) are diagrams is a circuit block of an encoder of the present invention based on the conversion tables in FIGS. 1 through 4.
Figure 5B:
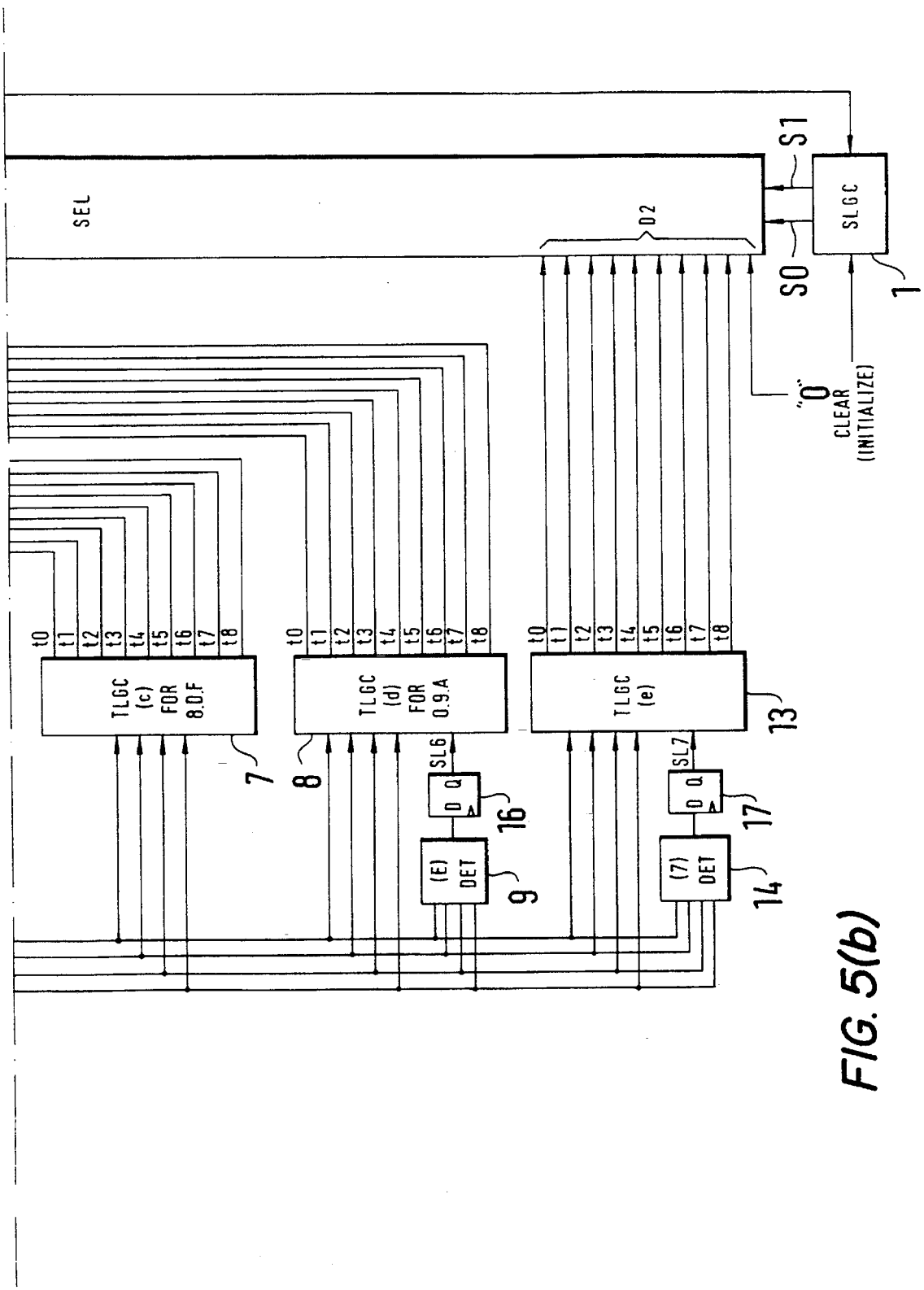
Figure 6:
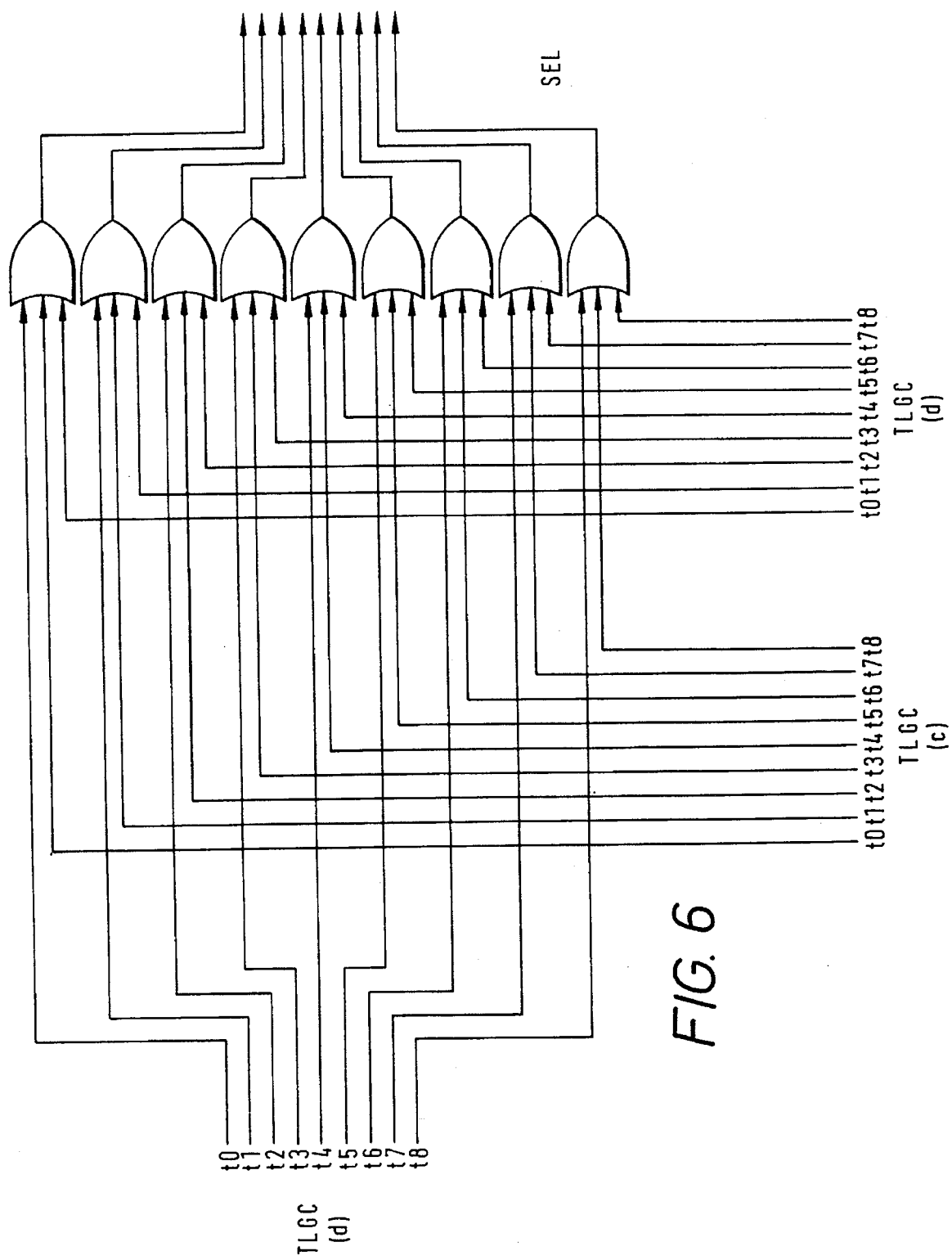
FIG. 6 is a circuit diagram showing the construction of a three-input OR gate block of the encoder shown in FIG. 5.

FIGS. 5(a) and 5(b) are a circuit block diagrams of an encoder that operates according to the conversion tables shown in FIGS. 1 through 4. In the initial state, outputs S0, S1 of a selector controller 1 are at "0" and a selector (SEL) 2 selects the D0 input. The output of a first conversion logic circuit, that is, the output of the TLGC(a) 3, is input directly to the selector 2. The output of a second conversion logic circuit in the same construction as the first conversion logic circuit, that is, the output of TLGC(b), is input to the selector 2 via a three-input OR gate 18. The specified construction of the three-input OR gate block 18 is shown in FIG. 6.

A truth table of the TLGC(a) 3 is shown in FIG. 7. The output SL1 of DET 4 and the output SL2 of DET 5 are used to determine if the value of a four-bit code word (Dn+1) to be input next is 6, 7, 8, D, F or 0, 9, A.

If the output SF1 of the TLGC(a) 3 is "1", the outputs of the selector controller 1 are updated to S0="1", S1="0" and the selector (SEL) 2 selects the D1 side. If SF1="0", the outputs are not updated and the selector (SEL) 2 is kept in the D0 selected state and the conversion of next code-word Dn+1 is made by the TLGC(a) 3.

If the selector (SEL) 2 selects the D1 side, the next code-word Dn+1 is converted by the conversion logic circuits TLGC(b) 6 for (6, 7), TLGC(c) 7 for (8, D, F) or TLGC(d) 8 for (0, 9, A). The outputs of the TLGC(b) 6, TLGC(c) 7 and TLGC(d) 8 are input to the three-input OR gate 18, respectively and select prescribed conversion outputs. Truth tables of the TLGC(b) 6, TLGC(c) 7 and TLGC(d) 8 are shown in FIGS. 8, 9 and 10, respectively.

If the code-word Dn+1=8, D, F, data is converted to the corresponding Tn+1 by the TLGC(c) 7. If Dn+1=0, 9 or A, data is converted to the corresponding Tn+1 by the TLGC(d) 8. In this case, the determination of whether the first code-word Dn is E or other than E is performed by (E) DET 9. Based on the result of this determination, the conversion is made according to the table shown in FIG. 2 or the table shown in FIG. 3.

On the other hand, if the code-word Dn+1=6 or 7, outputs Tn, Tn+1 and Tn+2 are decided by the second conversion logic circuit TLGC(b) 6 based on the outputs SL3, SL4 and SL5 of the DET 10 for (B, C, D, E), the DET 11 for (5, 8, A) and the DET 12 for (6, 7, F). The value of Tn+2 is further determined based on a value of a succeeding input data Dn+2, in addition to the output of a data latch 15.

If the code-word Dn+1 is other than 6 and 7, the output SF2 of the TLGC(b) 6 is "0" and the outputs of the selector controller 1 SLGC1 are restored to the initial state S0="0" and S1="0", and the selector (SEL) 2 selects D0.

If the code-word Dn+1=6 or 7, the output SF2 becomes "1", the outputs of the selector controller SLGC1 are updated to S0="0" and S1="1", and the selector (SEL) 2 selects D2.

A succeeding code-word Dn+2 is converted by the TLGC(e) 13. In this case, the determination of whether a preceding code-word Dn+1 is 7 or 6 is detected by (7) DET 14 and the corresponding conversion to the data Tn+2 is made according to the table shown in FIG. 2. After the conversion by selecting D2, the outputs of the selector controller 1 are restored to S0="0", S1="0" and the selector (SEL) 2 selects D0. A truth table of the TLGC(e) 13 is shown in FIG. 11.

Thus, although there is a restriction of maximum three code-words, the number of bits "0" between two bits of "1" is maintained to three or more in the converted code-words.

FIG. 12 shows a circuit block diagram of a decoder to realize the conversion tables shown in FIGS. 1 through 4. A selector controller 100 operates in the entirely same manner as the selector control circuit 1 of the encoder. That is, both the outputs S0 and S1 of the selector control circuit 100 under the initial state are "0" and the selector (SEL2) 19 selects the D0 input.

The first processing of encoded data Tn is carried out by a conversion logic circuit TLGC(f) 20 and restoration handling data D0 including the output SF1 which determines whether the data Tn+1, which is successively input to the decoder, is restricted and the output SL1 which determines whether the data Tn+1 is one of 0, 6, 7, 8, 9, A, D and F.

FIG. 13 shows the truth table of the TLGC(f) 20. If the output SL1 is "0", the outputs S0 and S1 of the selector control circuit 100 are kept in the initial state and the selector (SEL2) 19 selects D0 input. As a result, the data Tn+1 is processed in the same manner as in Tn data. If SL1="1", the outputs of the selector control circuit 100 are updated to S0="1" and S1="0" and the selector (SEL2) 19 selects D1. In this case, the data Tn+1 is processed by the TLGC(g) 21. The truth table of the TLGC(g) 21 is shown in FIG. 14.

TLGC(g) 21 further outputs restoration handling data D1 including an output SF2 showing whether the data Tn+2 successively input is restricted, an output SL2 showing that the data is one of B, C, D, and E, an output SL3 showing that the data is one of 5, 8 and A, and an output SL4 showing that the data is one of 6, 7 and F.

If the output SL2="0", both the outputs S0 and S1 of the selector control circuit 100 are restored to the initial state "0" and the selector (SEL2) 19 selects D0 input. If the output SL2="1", the outputs of the selector control circuit 100 are updated to S0="0" and S1="1" and the selector (SEL2) 19 selects D2. In this case, the data Tn+2 is converted by the TLGC(h) 22 according to information SL2, SL3 and SL4 at the preceding restoration of code-word Dn+1. The truth table of the TLGC(h) 22 is shown in FIG. 15. After the conversion of data Tn+2, the outputs of the selector control circuit 100 are restored to the initial state of S0="0" and S1="0" and the selector (SEL2) selects D0, correspondingly.

As described above, the decoder processes the restoration while judging whether the decoding of a received code-word is completed. In this case, although it is necessary to make a judgment as to which code-word is in the initial state. SYNC code, etc. are generally inserted at a fixed intervals to minimize any error.

Next, a table of input code sequence vs conversions code series showing actual code conversion according to the conversion rules described above is shown.

| HEX-Code | Input Code Sequence Bit-Pattern | Conversion Output Code Sequence Bit-Pattern |
|---|---|---|
|  | [Dn] | [Tn] |
| 0 | 0000 | 010000000 |
| 1 | 0001 | 001000000 |
| 2 | 0010 | 000100000 |
| 3 | 0011 | 000010000 |
| 4 | 0100 | 000001000 |
| 6 | 0110 | 100010000 |
| 7 | 0111 | 100001000 |
| 9 | 1001 | 010001000 |
| F | 1111 | 100000000 |
| 5 | 0101 | 000000100 |
|  | [Dn-Dn+1] | [Tn-Tn+1] |
| 5-8 | 0101-1000 | 000010001-000100000 |
| 5-D | 0101-1101 | 000010001-000010000 |
| 5-F | 0101-1111 | 000010001-000001000 |
| 5-6 | 0101-0110 | 000010001-000000000 |
|  | [Dn-Dn+1-Dn+2] | [Tn-TN+1-Tn+1] |
| 5-6-5 | 0101-0110-0101 | 000010001-000010001-000100000 |
| 5-6-8 | 0101-0110-1000 | 000010001-000010001-000010000 |
| 5-6-A | 0101-0110-1010 | 000010001-000010001-000001000 |
| 5-6-B | 0101-0110-1011 | 000010001-000100010-001000000 |
| 5-6-C | 0101-0110-1100 | 000010001-000100010-000100000 |
| 5-6-D | 0101-0110-1101 | 000010001-000100010-000010000 |
| 5-6-E | 0101-0110-1110 | 000010001-000100010-000001000 |
| 5-7 | 0101-0111 | 000010001-000000100 |
| 5-7-5 | 0101-0111-0101 | 000010001-000000001-000100000 |
| 5-7-6 | 0101-0111-0110 | 000010001-000010001-000010000 |
| 5-7-7 | 0101-0111-0111 | 000010001-000010001-000001000 |
| 5-7-8 | 0101-0111-1000 | 000010001-000000001-000010000 |
| 5-7-A | 0101-0111-1010 | 000010001-000000001-000001000 |
| 5-7-B | 0101-0111-1011 | 000010001-000000010-001000000 |
| 5-7-C | 0101-0111-1100 | 000010001-000000010-000100000 |
| 5-7-D | 0101-0111-1101 | 000010001-000000010-000010000 |
| 5-7-E | 0101-0111-1110 | 000010001-000000010-000001000 |
| 5-7-F | 0101-0111-1111 | 000010001-000100001-000100000 |

-continued

| HEX-Code | Input Code Sequence Bit-Pattern | Conversion Output Code Sequence Bit-Pattern |
|---|---|---|
| 8 | 1000 | 100000100 |
| 8-8 | 1000-1000 | 100000001-000100000 |
| 8-D | 1000-1101 | 100000001-000010000 |
| 8-F | 1000-1111 | 100000001-000001000 |
| 8-6 | 1000-0110 | 100000001-000000000 |
|  | [Dn-Dn+1-Dn+2] | [Tn-TN+1-Tn+1] |
| 8-6-5 | 1000-0110-0101 | 100000001-000010001-000100000 |
| 8-6-8 | 1000-0110-1000 | 100000001-000010001-000010000 |
| 8-6-A | 1000-0110-1010 | 100000001-000010001-000001000 |
| 8-6-B | 1000-0110-1011 | 100000001-000100010-001000000 |
| 8-6-C | 1000-0110-1100 | 100000001-000100010-000100000 |
| 8-6-D | 1000-0110-1101 | 100000001-000100010-000010000 |
| 8-6-E | 1000-0110-1110 | 100000001-000100010-000001000 |
| 8-7 | 1000-0111 | 100000001-000000100 |
|  | [Dn-Dn+1-Dn+2] | [Tn-TN+1-Tn+1] |
| 8-7-5 | 1000-0111-0101 | 100000001-000000001-000100000 |
| 8-7-6 | 1000-0111-1000 | 100000001-000010001-000010000 |
| 8-7-7 | 1000-0111-0111 | 100000001-000010001-000100000 |
| 8-7-8 | 1000-0111-1000 | 100000001-000000001-000010000 |
| 8-7-A | 1000-0111-1010 | 100000001-000000001-000001000 |
| 8-7-B | 1000-0111-1011 | 100000001-000000010-001000000 |
| 8-7-C | 1000-0111-1100 | 100000001-000000010-000100000 |
| 8-7-D | 1000-01111-1101 | 100000001-000000010-000010000 |
| 8-7-E | 1000-0111-1110 | 100000001-000000010-000001000 |
| 8-7-F | 1000-0110-1111 | 100000001-000010001-000100000 |
| A | 1010 | 010000100 |
| A-8 | 1010-1000 | 010000001-000100000 |
| A-D | 1010-1101 | 010000001-000010000 |
| A-F | 1010-1111 | 010000001-000001000 |
| A-6 | 1010-0110 | 010000001-000000000 |
|  | [Dn-Dn+1-Dn+2] | [Tn-TN+1-Tn+1] |
| A-6-5 | 1010-0110-0101 | 010000001-000010001-000100000 |
| A-6-8 | 1010-0110-1000 | 010000001-000010001-000010000 |
| A-6-A | 1010-0110-1010 | 010000001-000010001-000001000 |
| A-6-B | 1010-0110-1011 | 010000001-000100010-001000000 |
| A-6-C | 1010-0110-1100 | 010000001-000100010-000100000 |
| A-6-D | 1010-0110-1101 | 010000001-000100010-000010000 |
| A-6-E | 1010-0110-1110 | 010000001-000100010-000001000 |
| A-7 | 1010-0111 | 010000001-000000100 |
|  | [Dn-Dn+1-Dn+2] | [Tn-TN+1-Tn+1] |
| A-7-5 | 1010-0111-0101 | 010000001-000000001-000100000 |
| A-7-6 | 1010-0111-0110 | 010000001-000010001-000010000 |
| A-7-7 | 1010-0111-0111 | 010000001-000010001-000001000 |
| A-7-8 | 1010-0111-1000 | 010000001-000000001-000010000 |
| A-7-A | 1010-0111-1010 | 010000001-000000001-000001000 |
| A-7-B | 1010-0111-1011 | 010000001-000000010-001000000 |
| A-7-C | 1010-0111-1100 | 010000001-000000010-000100000 |
| A-7-D | 1010-0111-1101 | 010000001-000000010-000010000 |
| A-7-E | 1010-0111-1110 | 010000001-000000010-000001000 |
| A-7-F | 1010-0110-1111 | 010000001-000010001-000100000 |
| B | 1011 | 001000100 |
| B-8 | 1011-1000 | 001000001-000100000 |
| B-D | 1011-1101 | 001000001-000010000 |
| B-F | 1011-1111 | 001000001-000001000 |
| B-6 | 1011-0110 | 001000001-000000000 |
|  | [Dn-Dn+1-Dn+2] | [Tn-Tn+1-Tn+1] |
| B-6-5 | 1011-0110-0101 | 001000001-000010001-000100000 |
| B-6-8 | 1011-0110-1000 | 001000001-000010001-000010000 |
| B-6-A | 1011-0110-1010 | 001000001-000010001-000001000 |
| B-6-B | 1011-0110-1011 | 001000001-000100010-001000000 |
| B-6-C | 1011-0110-1100 | 001000001-000100010-000100000 |
| B-6-D | 1011-0110-1101 | 001000001-000100010-000010000 |
| B-6-E | 1011-0110-1110 | 001000001-000100010-000001000 |
| B-7 | 1011-0111 | 001000001-000000100 |
|  | [Dn-Dn+1-Dn+2] | [Tn-TN+1-Tn+1] |
| B-7-5 | 1011-0111-0101 | 001000001-000000001-000100000 |
| B-7-6 | 1011-0111-0110 | 001000001-000010001-000010000 |
| B-7-7 | 1011-0111-0111 | 001000001-000010001-000001000 |
| B-7-8 | 1011-0111-1000 | 001000001-000000001-000010000 |
| B-7-A | 1011-0111-1010 | 001000001-000000001-000001000 |

| HEX-Code | Input Code Sequence Bit-Pattern | Conversion Output Code Sequence Bit-Pattern |
|---|---|---|
| B-7-B | 1011-0111-1011 | 001000001-000000010-001000000 |
| B-7-C | 1011-0111-1100 | 001000001-000000010-000100000 |
| B-7-D | 1011-0111-1101 | 001000001-000000010-000010000 |
| B-7-E | 1011-0111-1110 | 001000001-000000010-000001000 |
| B-7-F | 1011-0110-1111 | 001000001-000010001-000100000 |
| C | 1100 | 001000010 |
| C-DCC | 1100-(DCC) | 000X00001-000001000 |
| C-0 | 1100-0000 | 000000001-000100000 |
| C-8 | 1100-1000 | 000100001-000100000 |
| C-9 | 1100-1001 | 000000001-000010000 |
| C-A | 1100-1010 | 000000001-000001000 |
| C-D | 1100-1101 | 000100001-000010000 |
| C-F | 1100-1111 | 000100001-000001000 |
| C-6 | 1100-0110 | 000100001-000000000 |
|  | [Dn-Dn+1-Dn+2] | [Tn-TN+1-Tn+1] |
| C-6-5 | 1100-0110-0101 | 000100001-000010001-000100000 |
| C-6-8 | 1100-0110-1000 | 000100001-000010001-000010000 |
| C-6-A | 1100-0110-1010 | 000100001-000010001-000001000 |
| C-6-B | 1100-0110-1011 | 000100001-000100010-001000000 |
| C-6-C | 1100-0110-1100 | 000100001-000100010-000100000 |
| C-6-D | 1100-0110-1101 | 000100001-000100010-000010000 |
| C-6-E | 1100-0110-1110 | 000100001-000100010-000001000 |
| C-7 | 1100-0111 | 000100001-000000100 |
|  | [Dn-Dn+1-Dn+2] | [Tn-TN+1-Tn+1] |
| C-7-5 | 1100-0111-0101 | 000100001-000000001-000100000 |
| C-7-6 | 1100-0111-0110 | 000100001-000100001-000010000 |
| C-7-7 | 1100-0111-0111 | 000100001-000100001-000001000 |
| C-7-8 | 1100-0111-1000 | 000100001-000000001-000010000 |
| C-7-A | 1100-0111-1010 | 000100001-000000001-000001000 |
| C-7-B | 1100-0111-1011 | 000100001-000000010-001000000 |
| C-7-C | 1100-0111-1100 | 000100001-000000010-000100000 |
| C-7-D | 1100-0111-1101 | 000100001-000000010-000010000 |
| C-7-E | 1100-0111-1110 | 000100001-000000010-000001000 |
| C-7-F | 1100-0110-1111 | 000100001-000010001-000100000 |
| D | 1101 | 101000010 |
| D-DCC | 1101-(DCC) | 010000010-000001000 / 100010001-000001000 |
| D-0 | 1101-0000 | 010000010-000100000 |
| D-8 | 1101-1000 | 100100001-000100000 |
| D-9 | 1101-1001 | 010000010-000010000 |
| D-A | 1101-1010 | 010000010-000001000 |
| D-D | 1101-1101 | 100010001-000010000 |
| D-F | 1101-1111 | 100010001-000001000 |
| D-6 | 1101-0110 | 100010001-000000000 |
|  | [Dn-Dn+1-Dn+2] | [Tn-TN+1-Tn+1] |
| D-6-5 | 1101-0110-0101 | 100010001-000010001-000100000 |
| D-6-8 | 1101-0110-1000 | 000100001-000010001-000010000 |
| D-6-A | 1101-0110-1010 | 100010001-000010001-000001000 |
| D-6-B | 1101-0110-1011 | 100010001-000100010-001000000 |
| D-6-C | 1101-0110-1100 | 100010001-000100010-000100000 |
| D-6-D | 1101-0110-1101 | 100010001-000100010-000010000 |
| D-6-E | 1101-0110-1110 | 100010001-000100010-000001000 |
| D-7 | 1101-0111 | 100010001-000000100 |
|  | [Dn-Dn+1-Dn+2] | [Tn-TN+1-Tn+1] |
| D-7-5 | 1101-0111-0101 | 100010001-000000001-000100000 |
| D-7-6 | 1101-0111-0110 | 100010001-000100001-000010000 |
| D-7-7 | 1101-0111-0111 | 100010001-000100001-000001000 |
| D-7-8 | 1101-0111-1000 | 100010001-000000001-000010000 |
| D-7-A | 1101-0111-1010 | 100010001-000000001-000001000 |
| D-7-B | 1101-0111-1011 | 100010001-000000010-001000000 |
| D-7-C | 1101-0111-1100 | 100010001-000000010-000100000 |
| D-7-D | 1101-0111-1101 | 100010001-000000010-000010000 |
| D-7-E | 1101-0111-1110 | 100010001-000000010-000001000 |
| D-7-F | 1101-0110-1111 | 100010001-000010001-000100000 |
| E | 1110 | 101000010 |
| E-DCC | 1110-(DCC) | 000X00010-000001000 |
| E-0 | 1110-0000 | 000000000-000100000 |
| E-8 | 1110-1000 | 000000010-000100000 |
| E-9 | 1110-1001 | 000000000-000010000 |
| E-A | 1110-1010 | 000000000-000001000 |
| E-D | 1110-1101 | 000000010-000010000 |
| E-F | 1110-1111 | 000000010-000001000 |
| E-6 | 1110-0110 | 000000010-000000000 |
|  | [Dn-Dn+1-Dn+2] | [Tn-TN+1-Tn+1] |
| E-6-5 | 1110-0110-0101 | 000010001-000010001-000100000 |
| E-6-8 | 1110-0110-1000 | 000100001-000010001-000010000 |
| E-6-A | 1110-0110-1010 | 000010001-000010001-000001000 |
| E-6-B | 1110-0110-1011 | 000010001-000100010-001000000 |
| E-6-C | 1110-0110-1100 | 000010001-000100010-000100000 |
| E-6-D | 1110-0110-1101 | 000010001-000100010-000010000 |
| E-6-E | 1110-0110-1110 | 000010001-000100010-000001000 |
| E-7 | 1110-0111 | 000010001-000000100 |
|  | [Dn-Dn+1-Dn+2] | [Tn-TN+1-Tn+1] |
| E-7-5 | 1110-0111-0101 | 000010001-000000001-000100000 |
| E-7-6 | 1110-0111-0110 | 000010001-000100001-000010000 |
| E-7-7 | 1110-0111-0111 | 000010001-000100001-000001000 |
| E-7-8 | 1110-0111-1000 | 000010001-000000001-000010000 |
| E-7-A | 1110-0111-1010 | 000010001-000000001-000001000 |
| E-7-B | 1110-0111-1011 | 000010001-000000010-001000000 |
| E-7-C | 1110-0111-1100 | 000010001-000000010-000100000 |
| E-7-D | 1110-011.1-1101 | 000010001-000000010-000010000 |
| E-7-E | 1110-0111-1110 | 000010001-000000010-000001000 |
| E-7-F | 1110-0110-1111 | 000010001-000010001-000100000 |

Figures 16, 17, 18:
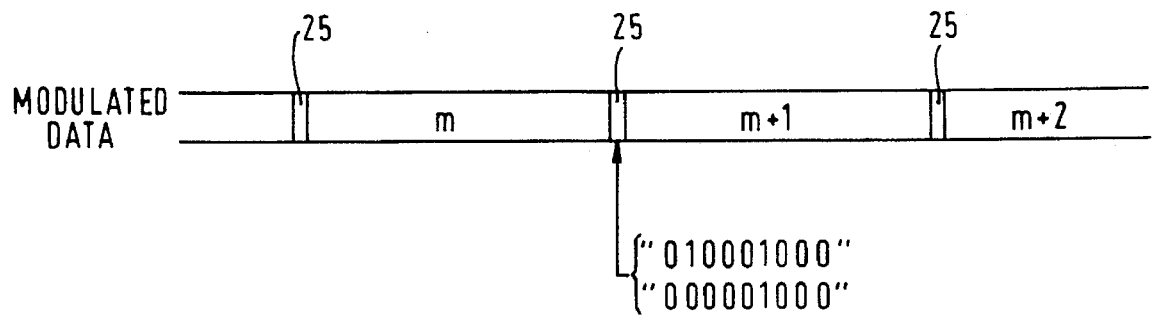
FIGS. 16 through 18 are diagrams showing a specific code inserting method and code tables showing specific code examples used for DSV control in the present invention.

Next, the DSV process will be explained. In the embodiment described in FIGS. 1 through 11, no process is executed to minimize the DSV. However a modulation system for minimizing the DSV may be needed for some applications. Therefore, the DSV process method used in the present invention will be explained. A system to insert a specific code (DC control code 25) at a fixed interval is shown in FIG. 16. Here, although it is preferable to minimize the number of bits of an inserting code; taking the ease of processing into consideration, a nine-bit code-word having the same size as a conversion code length will be explained.

DC control code 25 is available in two patterns: "010001000" and "000001000", and an appropriate pattern for making DSV smaller is selected and inserted. More specifically, for DC control code 25 to be inserted after (m)-series data, a pattern that minimize DSV finally is finally selected by calculating DSV up to the next (m+1)-series data. However, the "010001000" pattern cannot be inserted arbitrarily. For instance, after the "00100010" pattern three conversion codes corresponding to Dn=C, will cause the number of continuous bits of "0" to become two at the connecting point of both codes, so that the conversion rule cannot be satisfied. To prevent this problem, DC control code 25 is inserted after a data value of Dn=C, D or E, before the conversion is fixed to "000001000". Then, an appropriate value of the pattern E, as shown in FIG. 17, is selected for the Tn pattern corresponding to C, D, instead of a conversion pattern shown in the table in FIG. 1.

Further, when a second code is restricted by the next code, that is, when Dn+1=6, 7, the nine-bit patterns "000000000" and "000000100" are adopted as patterns corresponding to the conversion code Tn+1 for DC control code 25 according to a table, as shown in FIG. 18.

Further, it is also possible to use seven-bit patterns "0001000" and "0000000" for DC control code 25. If there is a conversion pattern having long lasting series of zero bits "0", before and after the seven-bit pattern "0000000", the maximum inversion interval Tmax becomes two long. Therefore, in this case, a bit pattern "0001000" will be selected. In any case, the above described control code insertion method not only prevents a decline of DSV but also prevents error propagation.

This embodiment avoids providing less than two continuous zero bits "0" between modulated code-words so that the minimum inversion interval Tmin becomes (4×4/9)T=1.78T and the detection window width Tw becomes (4/9)T=1.44T. As a result, it is possible to record a disc at a high density.

Next, the result of comparison test of the [4,9] modulation system of the present invention with the conventional EFM modulation system, which is conducted based on the embodiment described above, is shown in FIGS. 19 and 20.

Figure 19:
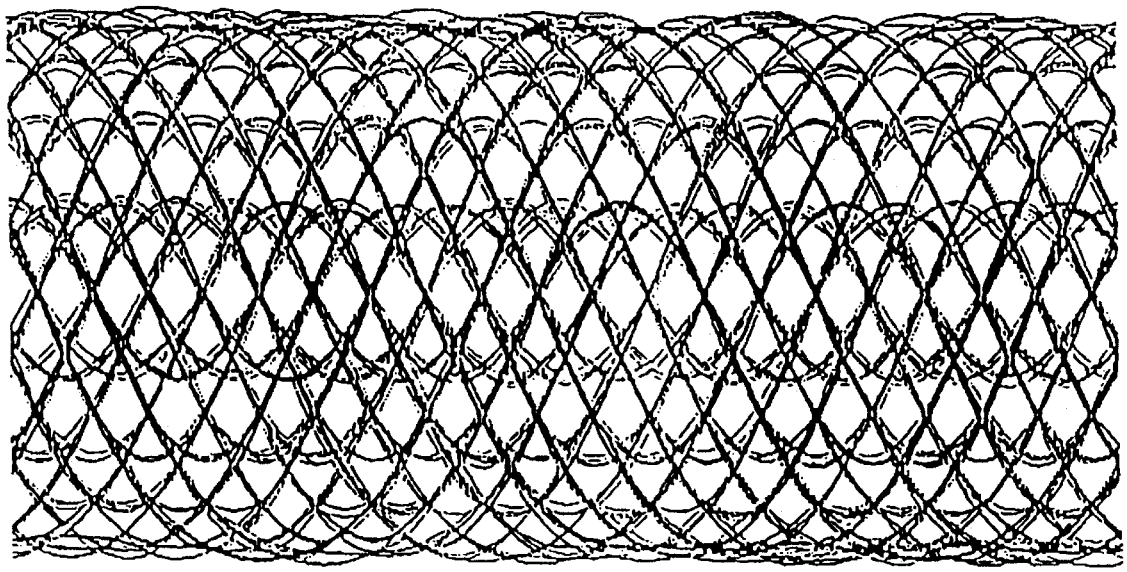
FIGS. 19 and 20 are graphs of test results showing the characteristics (the effects) of the present invention by comparing with a conventional EFM modulation system.
Figure 20:
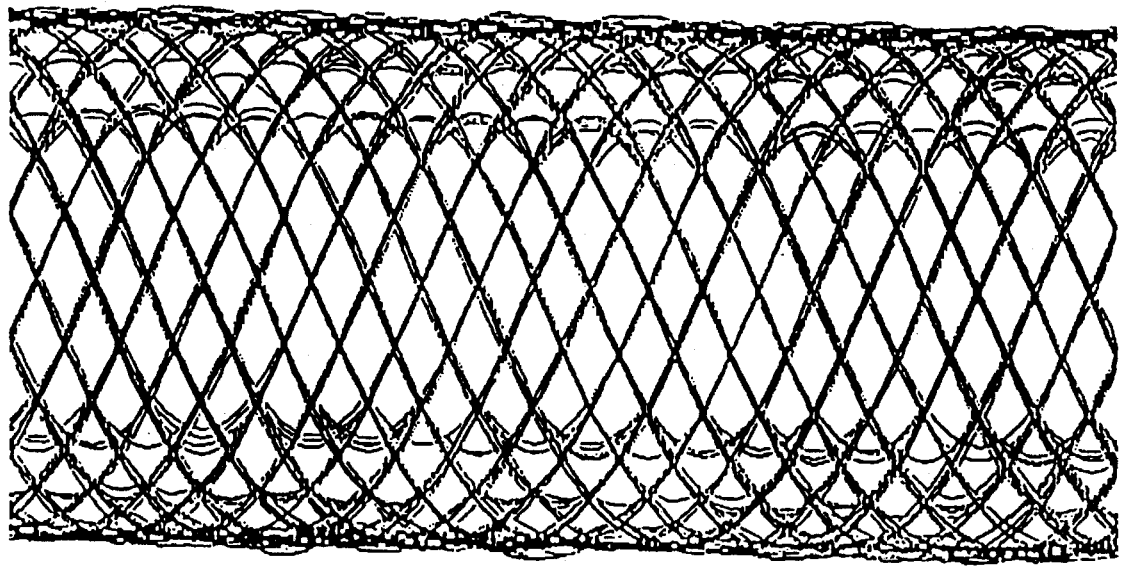

FIGS. 19 and 20 are graphs showing the eye pattern characteristics of a reproduced signal according to the conventional EFM modulation system and the eye pattern characteristic according to the [4,9] modulation system according to the present invention, respectively. Further, these characteristic graphs show the test results conducted under the conditions of the bit length Tp=0.725 mm, the minimum inversion interval of the former Tmin(A)=360 mm and the minimum inversion interval of the latter Tmin(B)= 480 mm to get the same recording density (4 gigabyte recording capacity). As can be seen from the comparison of FIGS. 19 and 20, the eye pattern (FIG. 20) of the reproduced signal according to the [4,9] modulation system of the present invention has an amplitude that is larger than the eye pattern (FIG. 19) according to the conventional EFM modulation system and it is therefore expected that read errors will be reduced extremely.

One embodiment of the present invention has been described above with reference to the drawings. The present invention, however, is not limited to the tables shown in FIGS. 1 through 4, FIGS. 7 through 11, FIGS. 13 through 15, and FIGS. 17 and 18.

The pattern of a conversion code T corresponding to an input code data "D" is variable in many ways and, for instance, Dn=0 and Dn=1 or Dn=8 and Dn=F can be exchanged with each other. In this embodiment, a code length was restricted to a maximum of three codes in some cases, but there will be no problem even when if the maximum is extended to four codes or limited to less than two codes. In short, it is satisfactory for the minimum inversion interval Tmin in four channel bit length, that is, Tmin=1.41T to be provided after NRZI by combining 26 kinds of nine-bit code-words containing a minimum of three zero bits of "0" between both a preceeding bit and its following one bit "1".

As described above, the present invention provides an extremely preferable digitl data modulation/demodulation system, which prevents the generation of less than 3 zero bits "0" between modulated code-words to be continuously converted. As a result it is possible to increase the minimum inversion interval Tmin to provided a large capacity optical disc with improved recording density.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A modulation system comprising:

means for providing a consecutive binary data sequence;

a separator for separating said consecutive binary data sequence into a plurality of code-words;

a first converter for converting a first code-word in said plurality of code-words into a first modulated code-word, wherein a pattern of said first modulated code-word is based on a pattern of a second code-word following said first code-word in said data sequence;

a second converter for converting said first code-word into a second modulated code-word, wherein a pattern of said second modulated code-word is based on said pattern of said second code-word following said first code-word in said data sequence; and a code selector for selecting one of said first and said second modulated code-words from among said modulated code-words such that a succession of said modulated code-words output by said code selector contains a minimum of three bits "0" between a first bit "1" and a following second bit "1" so that there is no less than two consecutive bits "0" between successive nine-bit modulated code-words in said succession of modulated code-words output by said code selector.

2. A data modulation system according to claim 1, further comprising a specific code inserting means for inserting a specific code into said succession of said modulated code-words output by said code selector.

3. A modulation system according to claim 1, further comprising a selector controller for controlling said code selector based on information included in said data sequence.

4. A modulation system according to claim 1, further comprising a third converter for converting a third code-word in said plurality of code-words into a third modulated code-word;

a fourth converter for converting a fourth code-word in said plurality of code-words into a fourth modulated code-word; and an OR gate receiving an output of said second and said third converter.

5. A data demodulation system comprising:

means for providing a providing a consecutive modulated code-word sequence;

a restoring means for restoring said consecutive modulated code-word sequence into four-bit code-words, said restoring means including a plurality of separate restoration units each producing different output patterns; and conversion rule updating means for updating conversion rules used to select said outputs of said separate restoration units, said rules being updated upon receiving modulated code-words up to an Nth modulated code-word that are consecutively received by said restoring means, wherein N is a positive integer.

6. A data demodulation system according to claim 5, further comprising control means for restoring said conversion rules for modulation codes to an initial state at prescribed intervals or whenever a specific code included in said modulated code-word sequence is detected.

7. A data modulator comprising:

a separator for separating a consecutive binary data sequence into a plurality of four-bit code-words;

a first four-to-nine converter for converting a first four-bit code-word in said plurality of separated four-bit code-words into a first nine-bit modulated code-word, wherein a pattern for said first nine-bit modulated code-word is based on a pattern of a second four-bit code-word following said first four-bit code-word in said data sequence;

a second four-to-nine converter for converting said four-bit code-word in said plurality of separated four-bit code-words into a second nine-bit modulated code-word, wherein a pattern for said second nine-bit modulated code-word is based on said pattern of said second four-bit code-word following said first four-bit code-word; and a code selector for selecting one of said first and said second nine-bit modulated code-words such that a succession of said nine-bit modulated code-words output by said code selector contains a minimum of three bits "0" between a first bit "1" and a following second bit "1" so that there is no less than two consecutive bits "0" between successive nine-bit modulated code-words output by said code selector.

8. A data modulator claimed in claim 7, further comprising a specific code inserting means for inserting a specific code into said succession of nine-bit modulated code-words output by said code selector.

9. A modulation system according to claim 7, further comprising a selector controller for controlling said code selector based on information included in said data sequence.

10. A modulation system according to claim 7, further comprising a third four-to-nine converter for converting a third four-bit code-word in said plurality of four-bit code-words into a third nine-bit modulated code-word;

a fourth four-to-nine converter for converting a fourth four-bit code-word in said plurality of four-bit code-words into a fourth nine-bit modulated code-word; and an OR gate receiving an output of said second and said third four-to-nine converter.

11. A data demodulator comprising:

a restoring means for restoring a said consecutive modulated code-word into four-bit code-words, said restoring means including a plurality of separate restoration units each producing different output patterns; and conversion rule updating means for updating conversion rules used to select said outputs of said separate restoration units, said rules being updated upon receiving modulated code-words up to an Nth modulated code-word that are consecutively received by said restoring means, wherein N is a positive integer.

12. A data demodulation system according to claim 11, further comprising means for restoring said conversion rules for modulation codes to an initial state at prescribed intervals or whenever a specific code included in said nine-bit modulated code-word sequence is detected.

13. A data modulator comprising:

a separating means for separating a consecutive binary data sequence into a plurality of four-bit code-words;

a first four-to-nine converting means for converting a first four-bit code-word in said plurality of separated four-bit code-words into a first nine-bit modulated code-word such that a pattern for said first nine-bit modulated code-word depends on a pattern of a second four-bit code-word following said first four-bit code-word in said data sequence;

a second four-to-nine converting means for converting said four-bit code-word in said plurality of separated four-bit code-words into a second nine-bit modulated code-word such that a pattern for said second nine-bit modulated code-word depends on said pattern of said second four-bit code-word following said first four-bit code-word; and a code selecting means for selecting one of said first and said second nine-bit modulated code-words such that a succession of said nine-bit modulated code-words output by said code selecting means contains a minimum of three bits "0" between a first bit "1" and a following second bit "1" so that there is no less than two consecutive bits "0" between successive nine-bit modulated code-words output by said code selecting means.

14. A modulator according to claim 13, further comprising a selector controller for controlling said code selector based on information included in said data sequence.

15. A modulator according to claim 13, further comprising a third four-to-nine converter for converting a third four-bit code-word in said plurality of four-bit code-words into a third nine-bit modulated code-word;

a fourth four-to-nine converter for converting a fourth four-bit code-word in said plurality of four-bit code-words into a fourth nine-bit modulated code-word; and an OR gate receiving an output of said second and said third four-to-nine converter.

16. A data demodulator comprising:

means for providing a sequence of modulated code-words;

a first restoring means for restoring a modulated code-word in said sequence of modulated code-words into a first code word;

a second restoring means for restoring said modulated code-word in said sequence of modulated code-words into a second code-word; and a selector means for selecting one of said first code-word and said second code-word based on a pattern of a preceding modulated code-word in said sequence of modulated code-words.

17. A data demodulator according to claim 16, further comprising control means for initializing said selecting means to an initial state at prescribed intervals or whenever a specific code included in said modulated code-word sequence is detected.

18. A data demodulator according to claim 16, further comprising a third four-bit restoring means for restoring said nine-bit modulated code-word in said sequence of nine-bit modulated code-words into a third four-bit code-word, wherein said a selector means further selects between said first, said second, and said third four-bit code-words based on said content of a preceding nine-bit modulated code-word in said sequence of nine-bit modulated code-words.

* * * * *